United States Patent [19]

Korbell

[11] 4,369,407
[45] Jan. 18, 1983

[54] REGULATOR TESTER

[75] Inventor: George K. Korbell, Euclid, Ohio

[73] Assignee: Sheller-Globe Corporation, Cleveland, Ohio

[21] Appl. No.: 295,262

[22] Filed: Aug. 24, 1981

Related U.S. Application Data

[63] Continuation of Ser. No. 70,806, Aug. 29, 1979, abandoned.

[51] Int. Cl.³ .............................. G01R 31/02
[52] U.S. Cl. ................................ 324/416; 324/158 R
[58] Field of Search ......... 324/158 MG, 158 R, 73 R, 324/416

[56] References Cited

U.S. PATENT DOCUMENTS

| | | | |
|---|---|---|---|
| 4,019,120 | 4/1977 | Fattic | 324/158 MG |
| 4,086,531 | 4/1978 | Bernier | 324/158 MG |
| 4,222,005 | 9/1980 | Naito | 324/416 |

FOREIGN PATENT DOCUMENTS

1508774  4/1978  United Kingdom.

OTHER PUBLICATIONS

"Operation Handbook for the Sollo-State Voltage Regulator Tester", Model CTW-1170, Jan. 1978, Heath Co., Benton Harbor, Mich.
"Operating Instructions for Model RT-1224", no date, Jimco, Raymore Missouri.
"Solid State Voltage Regulator Tester Instructions", 1-6-78, Charging System Specialties, Garland, Texas.

*Primary Examiner*—Ernest F. Karlsen
*Attorney, Agent, or Firm*—Yount & Tarolli

[57] ABSTRACT

Testing appartus and method for testing a regulator for switching current to an external load device in response to applied voltage, e.g., field current of an alternator. This tester is arranged to enable accurate determination of regulated voltages and operates to apply load circuitry to simulate in a closed loop mode of operation the operation of the regulator in its operating environment. A power delay circuitry is connected across the terminals of the regulator and supplies load current to a third terminal when the regulator is turned on by charging a capacitor in the delay circuitry. When the charge on the capacitor reaches a high limit, the regulator switches off and load circuitry is switched on to ramp the capacitor voltage downwardly until the regulator again switches on. The load circuitry at that time switches off. An auxiliary power supply is effective when the regulator is switched on to supply additional load current.

11 Claims, 3 Drawing Figures

REGULATOR TESTER

This is a continuation of application Ser. No. 070,806 filed Aug. 29, 1979, now abandoned.

The present invention relates to regulator testers for testing regulators for electrodynamic machines for providing electric power and more particularly to static regulators for controlling the field current of alternators such as alternators for vehicles which are driven by variable speed engines to supply battery charging current and DC load current for accessories etc. through a load rectifier and to such a testing apparatus and method which does not require a running alternator or a load battery set up to effect a testing of the regulator.

BACKGROUND OF THE INVENTION

The regulators to be tested commonly involve a voltage sensing circuit for sensing a voltage applied to the regulator and for switching a field switching device to a conductive or nonconductive condition to control field current to a machine to control the output voltage thereof. When the field switching device is controlling an alternator or the like and is in a conductive condition, field current flows to the field and when in a nonconductive condition, the field current is off. The voltage sensing circuitry normally includes semiconductor components, e.g., a Zener diode and a control transistor for switching on and off the field switching device which is commonly a transistor or transistors, e.g., a Darlington circuit arrangement. Also, alternator regulators are commonly provided with a diode circuit which is connected directly to the AC output of the armature windings of the alternator. The purpose of the diode circuit is to provide a voltage when the alternator is rotating, particularly on starting, to operate a switching circuit, commonly a transistor, in the regulator for causing the application of the voltage across the terminals of the regulator to the voltage sensing circuitry and to the field switching device. The regulator then operates to switch on the field switching device until the voltage rises to a maximum voltage regulation level. At this time, the voltage sensing circuit switches the field switching device off until the voltage drops to a lower voltage regulation level at which the voltage sensing circuitry again switches on the field current. The voltage sensing circuit commonly includes an adjustable voltage dividing circuit, e.g., a potentiometer, for adjusting the voltage at which the switching occurs as well as other components such as a capacitor for effecting fast switching and proper operation of the circuitry and a zener diode which switches on and off at the high and low voltage regulation levels.

Various types of testers have been utilized to test voltage regulators. One type of known tester is a static tester which utilizes a variable power supply and voltmeter, with the variable power supply being adjustable to various voltages to determine the switching voltages of the regulator. However, the measurement of the voltage setting in this type of tester is generally unpredictable with errors of up to 0.5 volts.

Dynamic testers have also been utilized. These testers have been open loop testers which periodically apply a voltage such as an A.C. voltage to the regulator to force the regulator to switch at the applied frequency. The measurement of voltage settings of such a tester will not commonly provide a performance test for various vital parts of a regulator, for example, capacitors.

SUMMARY OF THE INVENTION

The present invention involves a closed loop regulator tester in which the regulator is loaded with electronic circuitry which simulates the alternator and battery system so that the regulator responds in a manner which closely parallels its use in the actual system and eliminates the need for a running alternator or a battery hook-up.

In accordance with the preferred embodiment of the invention, a voltage is applied to the regulator from a power supply through a delay circuit. The magnitude of the voltage is such that it will cover the full range of voltages at which regulators to be tested are to switch off. This power supply to the delay circuitry need not be varied during the testing of a regulator. When the applied voltage from the delay circuit reaches a level at which the regulator switches off, the switching of the regulator connected into the tester activates load circuitry which is connected across the delay device to lower the voltage across the regulator according to the time constant of the delay device. The voltage across the regulator then decreases along a ramp until the sensing circuit of the regulator causes the regulator to turn on which causes the load circuitry to turn off. This corresponds to the regulator switching to a condition to turn on the field current in an alternator. At this point, the voltage starts to rise along a ramp until the regulator again switches off to start a new cycle. An indicating light may be used to indicate the status of the regulator and the load circuitry, i.e., on or off, and the voltage at the output of the delay circuit may be measured to indicate the voltage at which the switching occurs.

The tester preferably has circuitry connectable to a field terminal of the field regulator to provide load current to the switching device of the regulator when the latter is turned on and the load circuitry preferably has a control switch which is responsive to the voltage at the field terminal to switch the load circuitry on and off.

The voltage tester also preferably includes a connection for supplying a voltage to a rectifying circuit of a regulator to enable the switching on of circuitry for connecting terminals of the regulator across which the voltage to be regulated is applied to the regulating circuitry of the regulator. This provides a test of the rectifying circuit of such regulator and also enables the turning on of the voltage regulator.

The present invention also contemplates the provision of an auxiliary power supply which is connectable to a field terminal to supply additional load current to the field switching device when the regulator is in a field current conductive condition.

Preferably, the delay circuitry includes adjustable circuitry for varying the time rate of the power delay to control the rate of on-off cycles of the regulator.

It will be understood that while the invention relates to static regulators for alternators and similar machines, it is applicable to similar regulators for switching current to an external device on and off in response to changes in an applied voltage.

BRIEF DESCRIPTION OF THE DRAWINGS

The preferred embodiment of the present invention will be described with its reference to the accompanying drawings forming a part of the present specification for all subject matter disclosed therein and in which.

DESCRIPTION OF THE PREFERRED EMBODIMENT

Figure 1:
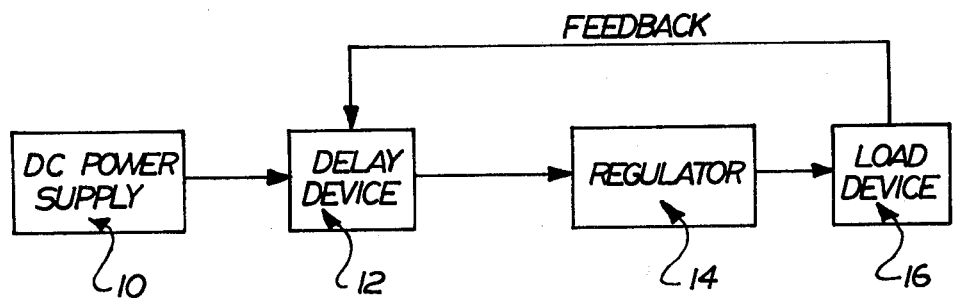
FIG. 1 is a block diagram of the tester with a regulator connected therein.

Referring to the drawings, the testing apparatus of the present invention includes a DC power supply 10 for supplying power through a delay circuit 12 to a regulator 14 to be tested. The regulator 14 when switched to a condition which would switch off the field current of an alternator in an actual system activates load circuitry 16 to draw load current from the delay device 12 to lower the voltage applied from the DC power supply 10 through the delay circuitry to the regulator 14 at a rate dependent upon the time constant of the delay circuitry and the load current.

Figure 2:
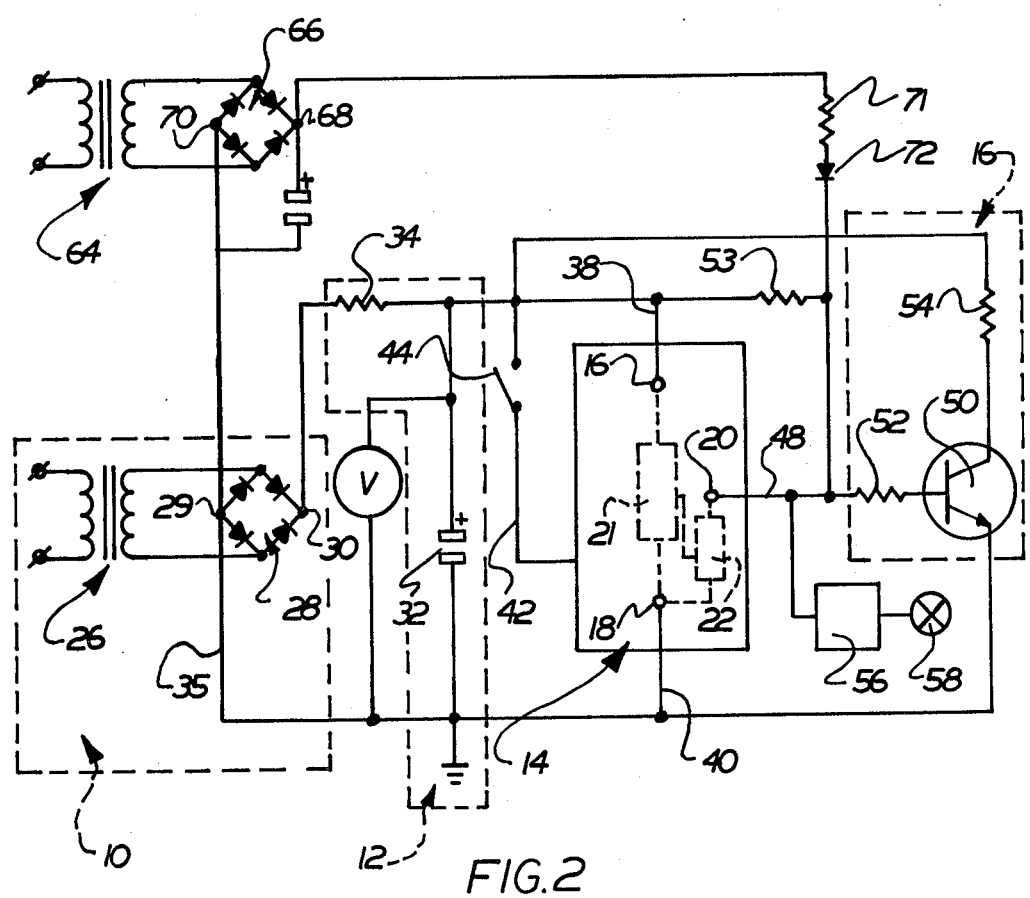
FIG. 2 is a circuit diagram of the preferred embodiment of the present regulator tester.

Referring to FIG. 2, the type of regulators to be tested commonly have three terminals: DC power supply terminals 16, 18 and field terminal 20, commonly designated on automotive type regulators as "—F". The voltage of the —F terminal will be at high and low voltage levels when the regulator is off and on respectively (the —F designation is not a polarity designation).

As illustrated in FIG. 2, the particular regulator to be tested comprises regulating circuitry including a voltage sensing circuit 21 connected across the DC terminals 16, 18 and a field switching device 22, which conventionally is a transistor, connected between the field terminal 20 and the negative DC power terminal 18. On application of DC power to the regulating circuitry, the field switching transistor will be turned on until the voltage sensing circuit senses that the voltage across the terminals 16, 18 is at a high regulation level at which the field circuit is to be switched off. At this point, the transistor 22 will be switched to a nonconductive condition and will remain in a nonconductive condition until the voltage drops to a low regulation level. At the low regulation level the regulating circuitry will operate in a conventional manner to switch the transistor 22 to a conductive position. When operating to control an alternator or the like with the illustrated type regulator, the field coil of the alternator would be connected to the positive terminal 16 and the —F field terminal 20 to complete the load circuit for the field switching transistor 22. The tester is provided with a circuit connection as explained hereinafter to provide load current for the field switching transistor 22.

As illustrated in FIG. 2, the power supply 10 of the testing apparatus includes a transformer 26 having its primary coil connected to a source of AC current, preferably 110 volts, and its secondary coil connected to a full wave rectifier bridge 28. The rectifier bridge 28 has output terminals 29, 30 with the terminals being connected to the input of the delay circuitry 12. The delay circuitry 12 includes a capacitor 32 with the positive bridge terminal 30 being connected to the capacitor 32 through a charging resistance 34 and the negative bridge terminal 29 being connected to the opposite side of the capacitor 32, ground in the illustrated circuit, by a lead 35. The tester has leads 38 and 40 to be connected to the regulator to be tested which are respectively connected to the positive and ground sides of the capacitor 32. In addition, the tester includes a lead 42 connected to the positive side of the capacitor 32 by a switch 44. The lead 42 provides a connection to a diode trio terminal of the regulator for effecting a turn on the regulator in response to an AC voltage on the windings of the alternator.

The tester also has load circuitry comprising a resistor 54 and a switching device, preferably a transistor 50, connected across the capacitor 32, i.e., the output of the delay circuitry. The collector of the resistor 50, an NPN transistor in the illustrated embodiment, is connected to the positive side of capacitor 32 through resistor 54 and the emitter is connected to the ground.

The tester further includes a lead 48 to be connected to the —F field terminal 20 of the regulator to provide load current for the transistor 22. The lead 48 is also connected to the base of the transistor 50 through a resistance 52 and to the positive side of the capacitor 32 through a resistor 53. Preferably, an indicating circuit 56, which may be a simple transistor switch controlled by the voltage at the —F terminal, for effecting energization of an indicating light 58 is connected to the lead 48 and operates to indicate the on or off condition of the regulator under testing by turning the light on and off. Such circuit arrangements are well within the ability of those skilled in the art.

In operation, the regulator is connected into the tester by connecting the leads 38, 40 and 48 of the tester to the regulator terminals 16, 18 and 20 respectively. The diode lead 42 is also connected and operates internal regulator cicuitry for switching the voltage applied to the terminals 16, 18 to the regulator circuitry for sensing voltage and applying a control signal to the field switching device 22 for switching the latter. This will effect an initial turn on of the field switching transistor as the voltage on capacitor 32 builds up to the high level of regulation where the regulator is switched off by the voltage regulating circuit. When the regulator transistor 22 is conducting, load current is drawn through the resistor 53 and lead 48 and the voltage at the —F terminal 20 is at a low level (about 1 volt). At this time the transistor 50 of the load circuitry is turned off. It will be appreciated that the resistor 53 relative to the charging resistor 34 is such that the voltage on capacitor 32 will ramp upwardly with the transistor 22 conducting. When transistor 22 switches off, the voltage of the —F terminal rises to a voltage which switches on the load circuitry of transistor 50, the voltage at the —F terminal being the voltage across the positive and negative poles of the regulator reduced by the dividing ratio of resistor 53 and resistor 52.

In the preferred embodiment, an auxiliary voltage supply comprising a transformer 64 and a full wave rectifying bridge 66 having positive and negative terminals 68, 70 is connected into the circuit to supply additional load current for the switching device 22 when the regulator is in a turned on state. The positive terminal 68 is connected to the lead 48 and, in turn, to the —F field terminal 20 of the regulator under test, by a connection including series connected resistor 71 and diode 72.

In operation, when the regulator is switched on, the voltage at the —F terminal drops to a low level and load current will flow from the auxiliary power supply as well as from the capacitor 32 through the resistor 53. When the voltage across the regulator under test rises, and the regulator turns off, the field switching transistor 22 becomes nonconductive and the voltage of the terminal 20 will rise and back bias diode 72 so that the auxiliary power supply is effectively disconnected from the circuit.

When the regulator turns off, the voltage of the −F field terminal rises to a voltage which is higher than the unloaded voltage from the auxiliary power supply 66 in order to effect a back biasing of the diode 72 but is below the voltage across the regulator because of the voltage divider formed by resistors 53, 52. The advantage of this configuration lies in the relatively low voltage power requirements of the power supply 66 necessary to provide load current for the field switching transistor when it is in an on condition. Commonly, the field switching transistor 22 of the regulator has a 4 ampere load with a 12 voltage alternator rotor (48 watts). The power supply requirements for such a regulator for a 3 volt auxiliary power supply would be 3 volts×4 amps or 12 watts for a full duty cycle or 6 watts for a half duty cycle to provide a 4 amp current load for the transistor (1 volt across the transistor when conducting).

Figure 3:
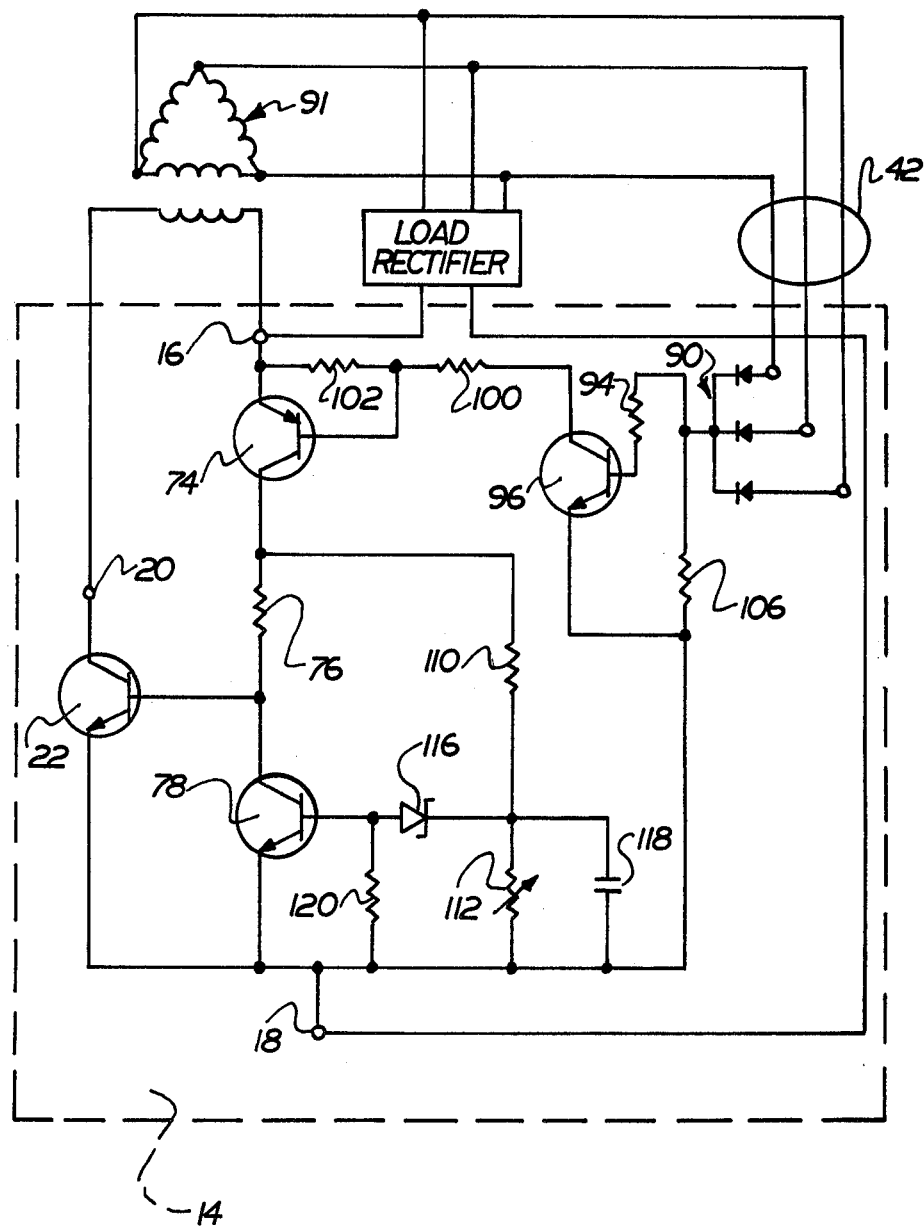
FIG. 3 is a circuit diagram for a typical regulator to be tested.

FIG. 3 is a schematic of a type of conventional regulator for testing the apparatus of FIG. 2. Referring to FIG. 3, the regulator is shown connected to an alternator and includes field switching transistor 22 for switching field current on and off to a field coil 80 of an alternator. The transistor 22 in the illustrated regulator is connected between the −F field terminal 20 of the regulator and the negative terminal 18. The transistor 22 is turned on by conventional switching circuitry connected across the terminal 16, 18 of the regulator. This circuit includes a PNP transistor 74 having its emitter connected to the positive regulator terminal and its collector connected to a resistor 76, the resistor 76 being connected to the base of transistor 22 to conduct base current thereto and to the collector of a transistor 78 having its emitter connected to the negative terminal 18. When the transistor 74 is in an on condition, base current is supplied to the transistor 22 to turn it on, unless the transistor 78 is conductive to effectively connect the resistor 86 directly to the negative terminal so that the transistor 22 is maintained in, or switched to, an off condition.

The transistor 74 is turned on in response to the output voltage of a diode trio 90 connected to the AC windings 91 of the alternator. The output of the diode trio 90 is connected through a resistor 94 to the base of a transistor 96 having its collector connected to the positive terminal 16 through resistors 100, 102, and its emitter connected to the terminal 18. A resistor 106 is connected from the output of the diode trio 90 to the negative terminal 18 to parallel the base-emitter circuit of transistor 96 including the base resistor 94. When there is an output voltage from the diode trio, the transistor 96 is turned on to establish current through the resistors 100, 102 which in turn turns on the transistor 74 by reason of its base connection to a junction between the resistors 101, 102. This effects a turn on of the field switching transistor 22 as long as the transistor 78 is nonconductive.

A voltage sensing circuit comprising resistors 110, 112 is connected from the collector of transistor 74 to the negative terminal 18. A zener diode 116 which will break down and become conductive to turn on the transistor 78 when the voltage applied across the terminals 18, 16 reaches a maximum value of regulation. The voltage at which the zener diode breaks down can be adjusted by adjusting the ratio of the resistors 110 and 112. For this purpose, resistor 112 is shown as adjustable. The resistor 112 is conventionally paralleled by a capacitor 118 and a resistor 120 is conventionally connected between the base of the transistor 78 and the negative terminal 18.

From the foregoing description of the regulator, it can be seen that when the tester (FIG. 2) applies a DC voltage across the regulator terminals 16 and 18 and to the diode trio, the regulator will supply base current to the transistor 22 through the operation of transistors 96 and 74. A load circuit is provided for the field switching transistor 22 when in the tester of FIG. 2 from the capacitor 32 through the lead 48 of the tester to the −F terminal 20. The regulator will remain in an on condition, i.e., transistor 22 conducting, until the voltage across the terminals 18 and 20 due to the ramping up of the voltage on capacitor 32 reaches a level where the Zener diode 116 breaks down to switch on the transistor 78 and render the transistor 22 nonconductive. If the capacitor 32 is fully charged when the connections are made to regulator 14, the regulator will be switched off by the action of its voltage sensing circuit.

As long as the transistor 22 is conductive, the voltage at field terminal 20 will be a low voltage and the load circuitry transistor 50 will remain in an off condition. When the transistor 22 is switched off by the voltage on capacitor 32, the voltage at the −F field terminal will rise to a value determined by the ratio of the resistors 53, 52 and as the voltage rises the load transistor 50 will be switched on to activate the load circuitry. The load circuitry will then operate as previously described and provides a simulation of a load on the alternator when the regulator is off and the voltage on the capacitor 32 will ramp downwardly until the zener diode 116 becomes non-conductive at the low regulation level to turn off transistor 78 to turn on transistor 22. It is understood that the downward ramp of the capacitor voltage is determined by the relationship of load resistor 54 and charging resistor 34.

The tester effects a test of all the vital circuit components of the regulator and is operative in the preferred embodiment with the auxiliary power supply to apply load current to the transistor 22 with a relatively low wattage power supply.

It will be appreciated that the switch on characteristics of the regulator at low RPMs of the alternator where the output is due to remnant magnetism of the core can readily be determined by applying a low voltage, for example, one volt to the diode trio lead. This will determine the operation of the diodes particularly, if the regulating cycle is then operated and the average regulated voltage does not differ significantly when the full output of the delay circuit 12 is applied to the diode trio lead.

The time constant of the delay circuit may be varied by varying the resistance of resistor 34 and for this purpose resistor 34 may be adjustable. On starting and for purposes of checking the diode trio, a switch 44 may be provided for disconnecting the capacitor 32 from the diode trio lead 42. By applying low voltage (not shown), it would then be simple to determine the turn on voltage of the regulator circuitry controlled by the diode lead 42. It will also be understood that the switching circuit 56 may include an inverter and integrator so that the light is on when the voltage at terminal 20 is low and off when high.

In certain regulators, the voltge of the −F terminal may be high when the regulator is on and low when off. For such a regulator, the resistor 53 would be switched to connect it to the negative side of capacitor 32 and an inverter would be switched into the base circuit of transistor 50 or a switch may be operated to disconnect lead 48 including resistor 52 from transistor 50 and to connect them to the base of a PNP transistor switch which connects resistor 54 to ground when the −F terminal is low.

What I claim is:

1. Apparatus for testing a regulator independently of the alternator or generator to which it is intended to be connected, said regulator having first and second terminals across which the output voltage of the alternator or regulator is normally applied, said regulator sensing said voltage and switching an internal switch between conductive and nonconductive states when said voltage moves beyond a predetermined acceptable range of values, where said internal switch is coupled between a third terminal of said regulator and one of said first and second terminals to control current flow through the field coil of said alternator or generator to which it is intended to connect said regulator, said apparatus comprising:

first static circuit means for generating an output voltage simulating the output of said alternator or generator to which it is intended to connect said regulator and for applying said simulated output voltage across said first and second terminals to cause said regulator, if operating properly, to switch said internal switch between said conductance states; and second static circuit means coupled between said third terminal and said one of said first and second terminals to which said internal switch is connected for generating a simulated field current of an alternator or generator and for applying said simulated field current to said third terminal, said second static circuit means comprising a low voltage power supply providing a low voltage power signal having a magnitude substantially smaller than the maximum level of said simulated output voltage, said low voltage supply having an impedance selected such that the magnitude of the current supplied to the internal switch is substantially the same as the rated field current of said alternator or generator with which said regulator is intended to be associated even though the voltage of said low voltage power signal is quite low, whereby little power is dissipated thereby.

2. Apparatus as set forth in claim 1, wherein said first current limiting means is a current limiting resistor.

3. Apparatus as set forth in claim 1, and further comprising second voltage applying means for providing a voltage having a level adequate to test the voltage handling capability of said internal switch when said switch is nonconductive, and second current limiting means connected between said second voltage providing means and said third terminal for limiting the current supplied to said third terminal by said second voltage providing means, when said internal switch is conductive, so that said second voltage applying means is not substantially loaded by said internal switch.

4. Apparatus as set forth in claim 3, wherein said voltage providing means comprises means for providing said test voltage to said third terminal through said second current limiting means, said test voltage then serving as said voltage having a level adequate to test the voltage handling capability of said internal switch.

5. Apparatus as set forth in claim 3, wherein said first current limiting means includes unidirectional current conducting means for blocking current flow into said low voltage power supply from said second voltage providing means when said internal switch is nonconductive, whereby said second voltage providing means is not then loaded by said current supplying means.

6. Apparatus as set forth in claim 5 wherein said unidirectional current conducting means is a diode.

7. Apparatus as set forth in claim 1, wherein said test voltage applying means comprises means for applying a test voltage to said regulator to cause said regulator, if operating properly, to cyclically change the conductance state of said internal switch between conductive and nonconductive states.

8. Apparatus as set forth in claim 1, wherein said test voltage applying means includes:

means for gradually changing said test voltage in a first direction such that said test voltage eventually reaches a boundary of said acceptable range of values whereby said regulator, if operating properly, will then change the conductance state of said internal switch; and feedback means coupled between said third terminal of said regulator and said test voltage changing means and responsive to the changed conductance state of said internal switch for modifying the operation of said test voltage changing means such that the test voltage then gradually changes in the direction opposite to said first direction, eventually reaching the other boundary of said acceptable range of values whereby said regulator, if operating properly, will then return said internal switch to its original conductance state causing said feedback means to stop modifying the operation of said test voltage applying means and thereby returning said test voltage to its original direction of change.

9. Apparatus as set forth in claim 7 or 8, and further comprising means for indicating the value of said test voltage for use in determining the voltage values at which said regulator changes the conductance of said internal switch.

10. Apparatus for testing a regulator having first and second terminals to which a voltage to be regulated is normally applied, said regulator sensing said voltage and switching an internal switch between conductive and nonconductive states when said voltage moves beyond a predetermined acceptable range of values, where said internal switch is coupled between a third terminal of said regulator and one of said first and second terminals to control current flow through an external device, said apparatus comprising:

test voltage applying means for applying a test voltage across said first and second terminals to cause said regulator, if operating properly, to switch said internal switch between said conductance states; and current supplying means comprising transformer means for transforming a commercial AC power signal down to a low voltage AC power signal having a peak voltage which is substantially less than said test voltage, means for rectifying and filtering said low voltage AC power signal to provide a low voltage DC power signal, and resistor means connected between said rectifying and filtering means and said third terminal for providing a current path from said current supplying means to said third terminal, said resistor means having a resistance value selected such that when said switch is conductive, a current passes therethrough from said current supplying means which is of substantially the same magnitude as the current which said switch is intended to carry during normal operation.

11. Apparatus for testing a regulator having first and second terminals to which a voltage to be regulated is normally applied, said regulator sensing said voltage and switching an internal switch between conductive and nonconductive states when said voltage moves beyond a predetermined acceptable range of values, where said internal switch is coupled between a third terminal of said regulator and one of said first and second terminals to control current flow through an external device, said apparatus comprising:

test voltage applying means for applying a test voltage across said first and second terminals to cause said regulator, if operating properly, to switch said internal switch between said conductance states; and internal switch testing means, comprising current testing means and voltage testing means wherein said current testing means includes a low voltage power supply providing a low voltage power signal having a magnitude substantially less than the maximum voltage to which said internal switch will be subjected during the normal operation of said regulator and unidirectional current conducting means in series with first resistance means for providing a current path between said low voltage power supply and said third terminal, said first resistance means having a resistance value selected such that the current supplied to said internal switch from said current testing means is approximately the level to which said internal switch will be subjected during normal operation of said regulator, and wherein said voltage testing means comprises means for providing a test voltage which is approximately the level of the maximum voltage to which said internal switch will be subjected during the normal operation of said regulator, and second resistance means for applying said test voltage to said third terminal, said resistance means having a value selected such that only a low level of current is drawn from said voltage testing means when said internal switch is in said conductive state, said unidirectional current conducting means of said current testing means being poled so as to block current flow from said means for providing a test voltage into said current testing means when said internal switch is open.

* * * * *